United States Patent Office 3,036,915

Patented May 29, 1962

3,036,915

PHOTOPOLYMERIZABLE COMPOSITIONS AND ELEMENTS

Norman Thomas Notley, Putney, England, assignor to E. I. du Pont de Nemours and Company, Wilmington, Del., a corporation of Delaware No Drawing. Filed Jan. 27, 1960, Ser. No. 4,856
10 Claims. (Cl. 96—84)

This invention relates to new photopolymerizable compositions, layers and elements. More particularly, it relates to photopolymerizable compositions which form flexible layers comprising a linear cellulosic polymer, a high molecular weight polyethylene oxide, an addition polymerizable ethylenically unsaturated compound, an addition-polymerization initiator activatable by actinic light, and finally a linear polyvinyl nitrogen-heterocyclic compound selected from the group consisting of polyvinylpyridine and polyvinylpyrrolidone. This invention also relates to photopolymerizable elements bearing a layer of said photopolymerizable compositions and to a process for preparing printing reliefs therefrom.

Solid compositions capable of polymerization under the influence of actinic light to rigid, insoluble, tough polymer-containing structures are known. Compositions of this type are described in Plambeck U.S. Patents 2,760,863 and 2,791,504. Additional photopolymerizable compositions are described in the British patent specifications Nos. 741,470, 786,119, 802,853 and 807,948. The compositions described in these references are particularly useful for the preparation of photopolymerizable printing plates. The prior compositions, however, are susceptible to variations in atmospheric conditions, and have a tendency to become brittle and crack upon aging, especially at low relative humidities and temperatures. It is therefore desirable to have printing plates which are flexible and are essentially free from brittleness after exposure and yet have reasonable firmness prior to exposure, so that the surface is smooth and is not easily damaged.

An object of this invention is to provide such compositions which are free from such disadvantages and form firm layers which are flexible and essentially free from brittleness after exposure to actinic light to form a polymer. Another object is to provide such plates (sold as photopolymer printing plates) which do not become brittle and crack or craze upon aging. A further object is to provide such plates which can be made on a commercial scale and result in high quality printing reliefs. Still further objects will be apparent from the following detailed description.

The photopolymerizable compositions, layers and elements provided by this invention comprise the following constituents:

(*a*) A compatible, addition-polymerizable, ethylenically unsaturated compound having a boiling point at normal pressure over 100° C., a molecular weight less than 1500 and containing one to four polymerizable ethylenic groups and capable of forming a high polymer by photoinitiated addition polymerization in the presence of an addition polymerization initiator therefor activatable by actinic light, (*b*) A small amount of a compatible, addition-polymerization initiator activatable by actinic light and not active thermally below 85° C.

(*c*) A mixture of polyethylene oxides having an average molecular weight of from about 100,000 to about 2,000,000, and (*d*) At least one essentially linear cellulose ester, preferably one containing free carboxylic acid or sulfonic acid groups or such groups neutralized by sodium, potassium or ammonium hydroxide and (*e*) A linear polyvinyl nitrogen-heterocyclic compound selected from the group consisting of polyvinylpyridine and polyvinylpyrrolidone.

The resulting composition forms photopolymerizable layers which, prior to exposure, due to component (*e*) have firm surfaces but yet after exposure are flexible and free from brittleness.

If desired, the photopolymerizable compositions described above can also contain (*f*) A thermal addition polymerization inhibitor.

In the foregoing compositions the various constituents are used in ranges of parts by weight as follows:

(*a*) From 10 to 60 parts
(*b*) From 0.0001 to 6.0 parts
(*c*) From 2 to 25 parts
(*d*) From 40 to 90 parts
(*e*) From 0.5 to 10 parts
(*f*) From 0.001 to 6.0 parts The preferred photopolymerizable compositions contain as constitutents (*a*) an acrylic acid ester of a diol of the formula $HO(CH_2CH_2O)_nH$ wherein $n$ is a positive integer from 1 to 30. Mixtures of such compounds can be used, particularly diesters of mixtures of polyethylene glycol, wherein the average molecular weight of the precursor of the formula just recited is between 200 and 600.

Photopolymerizable elements can be made from the compositions in the same manners as described in the U.S. patents and British patent specifications referred to above.

The photopolymerizable elements provided by the invention have improved properties due to the presence of the polyethylene oxide having average molecular weight above 100,000. Photopolymerizable compositions are known containing polyethylene oxides of relatively low molecular weight, e.g., 1000 to 5000, but these elements do not have the enhanced flexibility which results from the use of the polyethylene oxide of average molecular weight greater than 100,000.

The photopolymerizaable elements can be used to make photopolymerizable printing plates after the manner described in the U.S. patents and British patent specifications described above by exposure to actinic light through an image-bearing transparency or stencil.

This invention is further illustrated by but is not intended to be limited to the following examples.

*Example I*

A photopolymerizable composition was prepared by milling 55 g. of cellulose acetate hydrogen succinate, 2 g. of poly-2-vinylpyridine, 10 g. of a high molecular weight polyethylene oxide (average molecular weight of 100,000), 33 g. of triethylene glycol diacrylate, 0.033 g. of anthraquinone and 0.033 g. of p-methoxyphenol on a rubber mill for 30 minutes at 120° C. The composition was pressed at 150° C. into a clear photopolymerizable layer, 40-mils in thickness and bonded to an aluminum base support, 10-mils thick, as described in Example 1 of the application of Burg, Serial No. 750,868, filed July 25, 1958.

The resulting element was placed in a vacuum frame and the photopolymerizable surface brought into contact with a line process photographic negative. The vacuum frame containing the element and negative was placed beneath a 1,800 watt high-pressure mercury arc and the photopolymerizable element was exposed to 1.75 watts of actinic radiation per sq. in. for 3 seconds. After exposure, the negative was stripped from the plate, and the unexposed polymer was removed by spray washing for 10 minutes with an 0.04 N aqueous solution of NaOH. A sharp relief image firmly bonded to the base support and corresponding to the clear areas of the negative was obtained. The element was essentially free from brittleness after being maintained for 3 days under conditions of 16 percent relative humidity and a temperature of 21° C. The element was wrapped around a printing press cylinder, 4 inches in diameter, without cracking. The printing element showed excellent image quality when used for printing on a rotary press. A second photopolymerizable element was prepared and tested as described above except that the polymeric component of the photopolymerizable composition consisted solely of cellulose acetate hydrogen succinate. The element was extremely brittle and could not be bent to fit a 9 inch diameter printing press cylinder, without cracking.

*Example II*

Example I was repeated except that the photopolymerizable composition was prepared from 53 g. of cellulose acetate hydrogen succinate, 2 g. of poly-2-vinylpyridine, 10 g. of polyethylene oxide (average molecular weight of 100,000), 35 g. of polyethylene glycol diacrylate with an average molecular weight of the diol precursor of 300, 0.035 g. of anthraquinone and 0.035 g. of p-methoxyphenol. The printing element, after conditioning as described in Example I, was free from brittleness and was wrapped around a printing press cylinder, 4 inches in diameter, without cracking.

*Example III*

Example I was repeated except that the photopolymerizable composition was prepared from 51 g. of cellulose acetate hydrogen succinate, 2 g. of poly-2-vinylpyridine, 10 g. of polyethylene oxide described in Example I, 37 g. of polyethylene glyocl diacrylate with an average molecular weight of the diol precursor of 600, 0.037 g. of anthraquinone and 0.037 g. of p-methoxyphenol. The printing element, after conditioning as described in Example I, was free from brittleness and was wrapped around a printing press cylinder, 4 inches in diameter, without cracking.

*Example IV*

Example I was repeated except that the polyvinylpyridine was replaced by 6 g. of polyvinylpyrrolidone. The element was exposed as described in Example I to 1.75 watts of actinic radiation per square inch for 3 seconds and the unexposed polymer washed out by spray washing for 9 minutes with an 0.04 N aqueous solution of NaOH. The image was of comparable quality to that described in Example I. The element was flexible, was free from brittleness and was wrapped around a printing press cylinder, 4 inches in diameter, without cracking. The printing element showed excellent image quality, when used for printing on a rotary press.

*Example V*

A photopolymerizable composition was prepared by milling for 25 minutes on a rubber mill at 105° C. the following components:

236 g. triethylene glycol diacrylate
300 g. cellulose acetate
54 g. polyethylene oxide (molecular weight of about 500,000)
10.6 g. polyvinyl pyridine, described in Example I
0.24 g. anthraquinone
0.24 g. p-methoxyphenol
722 g. ethanol The solid composition was removed from the mill and pressed at a pressure of 2,000 lbs. per square inch at 160° C. for 1.5 minutes to form a layer 40 mils in thickness. The press platens, while still under pressure, were allowed to cool. The sheet was removed from the press and laminated to a sheet of steel, 25 mils in thickness, as described in Example 5 of the application of Burg, Serial No. 750,868, filed July 25, 1958. The element formed was exposed through a line process photographic negative to 1.75 watts of actinic radiation per square inch for 20 seconds as described in Example I, and the unexposed areas were washed out by the use of acetone. The printing element formed was conditioned for 6 hours at 15 percent relative humidity and 21° C. The element was essentially free from brittleness and was bent around a printing cylinder 5.5 inches in diameter without cracking.

*Example VI*

A mixture of 41 g. of triethylene glycol diacrylate, 40 g. of cellulose hydroacetate and 26 g. of glutaric anhydride was milled for 5 minutes on a rubber mill at 125° C. A mixture of 7.6 mil of diethylcyclohexylamine and 5 g. of cellulose acetate was added to the milling mixture over a 5 minute period, and the milling was continued for 10 more minutes. Ten and five-tenths grams of polyethylene oxide, molecular weight of 100,000, was then added and after milling for an additional 5 minutes, 2.4 g. of poly-2-vinylpyridine in 45 ml. of ethanol was added. The photopolymerizable mixture was milled for 5 more minutes and then removed from the mill. The composition was pressed to form a sheet 40 mils in thickness as described in Example V and laminated to a steel support as described in that example. The image was exposed as described in Example I to 1.75 watts of actinic radiation per square inch for 16 seconds. The unexposed areas were removed by spray washing for 10 minutes with an 0.08 N aqueous solution of NaOH. A sharp relief image corresponding to the relief described in Example I was obtained. The printing element was essentially free from brittleness after being maintained for 7 days at 15% relative humidity and 22° C. and was wrapped around a 3.5 inch printing cylinder, without cracking. A second photopolymerizable element was prepared as described above except that the polymeric component consisted solely of cellulose acetate glutarate. The element was extremely brittle after conditioning as described above and could not be bent to fit an 8-inch diameter printing press cylinder without cracking.

*Example VII*

A mixture of 157 g. of triethylene glycol diacrylate, 169 g. of cellulose hydroacetate and 148 g. of phthalic anhydride were mixed for 5 minutes on a rubber mill at 125° C. Fifty milliliters of diethylcyclohexylamine was added, and the milling was continued for 10 minutes. At this time, 47.7 g. of the polyethylene oxide described in Example I was added. After milling for 5 more minutes, 9.5 g. of poly-2-vinylpyridine dissolved in 100 ml. of ethanol was added to the mixture, followed by an additional 5 minute milling period. Upon removal of the photopolymerizable composition from the rubber mill, a sheet of the composition, 40 mils in thickness, was formed by the procedure described in Example V. The sheet was then laminated to the sheet steel base support as described in Example 5 of the application of Burg, Serial No. 750,868, filed July 25, 1958. The photopolymerizable element was exposed through a line process photographic negative to the light source described in Example I. Each square inch of the surface received 1.75 watts of actinic radiation for 16 seconds. The unexposed areas were removed by spray washing the element at 30° C. for 15 minutes in an 0.04 N aqueous solution of NaOH. A sharp relief image corresponding to the relief described in Example I was obtained. The element was maintained at 15 percent relative humidity and 23° C. temperature for 3 days. The printing element exhibited essentially no brittleness upon flexing and was wrapped around a 3.7-inch diameter printing cylinder without cracking. A second photopolymerizable element was prepared as described above except that the initial mixture contained 226 g. of cellulose hydroacetate, 157 g. of triethylene glycol diacrylate and 148 g. of phthalic anhydride. After the addition of the diethylcyclohexylamine no other components were added and the milling was continued for 10 minutes. The photopolymerized printing element obtained was maintained at 15 percent relative humidity and 23° C.

temeprature for 24 hours. The element cracked completely, when wrapped around a 10 inch cylinder.

Suitable addition-polymerizable ethylenically unsaturated compounds (*a*), in addition to the preferred triethylene glycol diacrylate and polyethylene glycol diacrylates with an average molecular weight of the diol precursor of 200 to 600, include vinylidene monomers, particularly the vinyl monomers described in Plambeck U.S. Patent 2,791,504, col. 17, line 62, to col. 18, line 16, acrylic or methacrylic acid esters of diethylene glycol, triethylene glycol and higher polyalkylene glycols, e.g., methoxytriethylene glycol acrylate, ethylene glycol dimethacrylate, diethylene glycol dimethacrylate, triethylene glycol dimethacrylate, diethylene glycol diacrylate, methoxytriethylene glycol methacrylate, di- and triethylene glycol acrylates, and methacrylates, the acrylates, diacrylates, methacrylates and dimethacrylates of tetraethylene glycol, dipropylene glycol, and polybutylene glycols. Still other useful compounds include the diacryates and dimethacrylates of ether-glycols which also contain a combined intrachain dibasic acid unit, e.g., the diacrylate or dimethacrylate of $$HOCH_2CH_2OCH_2CH_2O—OCRCOOCH_2CH_2OCH_2CH_2OH$$

where R is a divalent hydrocarbon radical, e.g., methylene or ethylene. Other useful vinyl monomers include glycerol triacrylate, 1,2,4-butanetriol trimethacrylate and pentaerythritol tetramethacrylate.

An addition polymerization initiator (*b*) activatable by actinic radition and which is inactive thermally below 85° C. is added in amounts of from 0.0001 to 6 parts by weight, preferably 0.001 to 0.2 part by weight. Examples of initiators inactive thermally at 85° C. and below are vicinal ketaldonyl compounds such as diacetyl, benzil, etc., α-ketaldonyl alcohols such as benzoin, pivaloin, etc., acyloin ethers such as benzoin methyl or ethyl ethers, alphahydrocarbon substituted aromatic acyloins including α-methylbenzoin, α-allylbenzoin and α-phenylbenzoin. Preferably, however, the photoinitiators are thermally inactive below 185° C. The antraquinone photoinitiators fall within this range. In addition to anthraquinone other suitable initiators include 9, 10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1, 2-benzanthraquinone, 2,3-benzanthraquinone, 2-methyl-1,4-naphthoquinone, 2,3-dichloronaphthoquinone, 1,4-dimethylanthraquinione, 2,3 - dimethylanthraquinone, 2-phenylanthraquinone, 2,3-diphenylanthraquinone, sodium salt of anthraquinone alphasulfonic acid, 3-chloro-2-methylanthraquinone, retenquinone, 7,8,9,10-tetrahydronaphthacenequinone, and 1,2,3,4 - tetrahydrobenz[a]anthracene-7,12-dione.

The polymeric constituents of the photopolymerizable composition comprise (*c*) polyethylene oxide having a molecular weight of from 100,000 to 2,000,00; (*d*) at least one essentially linear cellulose ester polymeric compound, e.g., cellulose partial ester of a saturated monocarboxylic acid of 2 to 4 carbon atoms, e.g., cellulose acetate, cellulose acetate propionate, cellulose acetate butyrate, and derivatives of said cellulose ester, e.g., cellulose acetate succinate, cellulose acetate glutarate, cellulose acetate phthalate, etc. and; (*e*) a linear polyvinyl nitrogen-heterocyclic compound selected from the group consisting of polyvinylpyridine and polyvinylpyrrolidone.

A thermal addition polymerization inhibitor (*f*) is present in the preferred composition. Suitable thermal polymerization inhibitors that can be used in addition to the preferred p-methoxyphenol include hydroquinone and alkyl and aryl-substituted hydroquinones, tert-butyl catechol, pyrogallol, copper resinate, naphthylamine, beta-naphthol, cuprous chloride, 2,6-di-tert-butyl-p-cresol, phenothiazine, pyridine, nitrobenzene and dinitrobenzene.

Other useful inhibitors include p-toluquinone and chloranil.

The novel photopolymerizable compositions are useful in the preparation of flexible, essentially non-brittle photopolymerizable printing elements comprising an adherent support having superposed thereon a solid layer of the just described photopolymerizable composition from 3 to 250 mils in thickness. The thickness of the photopolymerizable layer will vary according to the use. These thickness ranges are disclosed in Plambeck U.S. Patent 2,791,504, col. 3, lines 17 to 25.

The bases or supports for the photopolymerizable elements of this invention are preferably flexible and composed of metal, e.g., aluminum or steel, but they can be rigid. They also can be made of various film-forming resins or polymers. Suitable supports are disclosed in U.S. Patent 2,760,863, col. 5, lines 14 to 33. Various anchor layers as disclosed in this patent may be used to give strong adherence between the base and the photopolymerizable layer. The adhesive compositions disclosed in assignee's U.S. application of Burg, Serial No. 750,868, filed July 25, 1958, are also very effective.

An antihalation material can be present in the support, or in a layer or stratum on the surface of the support, or can be contained in the anchor layer. With transparent or translucent supports, the antihalation material may be on the rear surface of the element. When antihalation material is used it preferably should be sufficiently absorptive of actinic light to permit reflectance from the support or combined support of no more than 35% of incident actinic light.

To form the printing plate, the printing element is exposed to actinic light through a process transparency, e.g., a process negative or positive (an image-bearing transparency consisting solely of substantially opaque and substantially transparent areas where the opaque areas are substantially of the same optical density, the so-called line or halftone negative or positive).

The photopolymerizable elements may be exposed to actinic light from any source and of any type. The light source should, however, furnish an effective amount of ultraviolet radiation, since free-radical-generating addition-polymerization initiators activatable by actinic light generally exhibit their maximum sensitivity in this range. Suitable sources include carbon arcs, mercury-vapor arcs, fluorescent lamps with special ultraviolet-light-emitting phosphors, argon glow lamps, and photographic flood lamps. Of these, the mercury-vapor arcs, particularly the sunlamp type, and the fluorescent sunlamps, are most suitable. The sunlamp mercury-vapor arcs are customarily used at a distance of one and one-half to ten inches from the photopolymerizable layers.

The unexposed areas of the photopolymerized elements described herein are preferably removed by means of an aqueous solution. Suitable aqueous solutions include preferably alkali metal hydroxides, e.g., sodium and potassium, and in addition, ammonium, ammonium substituted hydroxides and the basic reacting salts of the alkali metal hydroxides, especially those of weak acids, e.g., the carbonates, bicarbonates and acetates. Generally the base will be present in concentrations ranging from about 0.01 to about 10 percent, although normally solutions greater than about 5 percent will not be used. The washout solution may be applied in any conventional manner, as by pouring, immersion, spraying or brushing in removing the unpolymerized areas. In some instances organic solvents, e.g., acetone and methyl acetate are useful, for instance, when a cellulose partial ester of a saturated monocarboxylic acid is present. If desired, the inert inorganic or organic filler materials described in Plambeck U.S. Patent 2,760,863 or Patent 2,791,504 can be added.

The photopolymerizable compositions of the instant invention are useful in the preparation of printing reliefs which are flexible and essentially free from brittleness and in the form of layers have a satisfactory degree of firmness prior to exposure, so that the surface is retained. The printing reliefs made in accordance with this invention can be used in all classes of printing but are particularly useful in those classes of printing wherein a distinct difference of height between printing and non-printing areas is required. These classes include those wherein the ink is carried by the raised portion of the relief such as in dry-offset printing, ordinary letterpress printing, the latter requiring greater height differences between printing and non-printing areas, and those wherein the ink is carried by the recessed portions of the relief such as in intaglio printing, e.g., line and inverted halftone. The plates are useful for multicolor printing.

The photopolymerizable compositions are also useful in the preparation of photoresists for etching, gravure, etc.; planographic plates; matrices for printing mattes; and screens for "silk screen" printing or as stencils. The compositions can be coated onto printing cylinders, e.g., plastic or metal cylinders.

The photopolymerizable compositions are suitable for other purposes, in addition to the printing uses described above, in which readily insolublized, solid, addition polymerizable compositions are useful, e.g., as ornamental plaques or for producing ornamental effects; as patterns for automatic engraving machines, foundry molds, cutting and stamping dyes, name stamps, relief maps; for braille; as rapid cure coatings, e.g., on film base, inside tanks; as variable area and variable density sound tracks on film; for embossing plastics, paper, etc., e.g., with a die prepared from said photopolymerizable compositions; in the preparation of printed circuits; for affixing phosphors to surfaces to provide color television screens; and in the preparation of other plastic articles.

An advantage of the preferred form of this invention is that it provides photopolymerizable compositions which are useful in the preparation of printing plates whose surfaces are firm and show excellent retentive qualities of their printing images prior to exposure. The printing reliefs are particularly advantageous because they are essentially free from brittleness after exposure to actinic light, especially at conditions of low relative humidity and temperature. The printing elements are flexible, thereby making them advantageous for use in rotary printing presses. In addition, the printing reliefs are not affected by most printing inks and cleaning solutions.

I claim:

1. A photopolymerizable composition comprising (*a*) an addition-polymerizable ethylenically unsaturated compound having a boiling point above 100° C. at normal pressure, a molecular weight less than 1500, containing 1 to 4 terminal ethylenic groups and being capable of forming a high polymer by photoinitiated addition polymerization in the presence of an addition polymerization initiator therefor activatable by actinic light, (*b*) an addition polymerization initiator activatable by actinic light and inactive thermally below 85° C., (*c*) a mixture of polyethylene oxides having an average molecular weight from about 100,000 to about 2,000,000, (*d*) at least one essentially linear cellulose ester and (*e*) a polyvinyl nitrogen-heterocyclic compound selected from the group consisting of polyvinylpyridine and polyvinylpyrrolidone; said constituents (*a*), (*b*), (*c*), (*d*) and (*e*) being present in the respective amounts of 10 to 60, 0.0001 to 6, 2 to 25, 40 to 90 and 0.5 to 10 parts by weight.

2. A composition as defined in claim 1 wherein constituent (*a*) is an acrylic acid diester of a mixture of polyethylene glycols of average molecular weight between 200 and 600.

3. A composition as defined in claim 1 wherein constituent (*d*) is cellulose acetate.

4. A composition as defined in claim 1 wherein constituent (*d*) is cellulose acetate succinate.

5. A photopolymerizable element comprising a support and a layer of a photopolymerizable composition comprising (*a*) an addition-polymerizable ethylenically unsaturated compound having a boiling point above 100° C. at normal pressure a molecular weight less than 1500, containing 1 to 4 terminal ethylenic groups and being capable of forming a high polymer by photoinitiated addition polymerization in the presence of an addition polymerization initiator therefor activatable by actinic light, (*b*) an addition polymerization initiator activatable by actinic light and inactive thermally below 85° C., (*c*) a mixture of polyethylene oxides having an average molecular weight from about 100,000 to about 2,000,000, (*d*) at least one essentially linear cellulose ester and (*e*) a polyvinyl nitrogen-heterocyclic compound selected from the group consisting of polyvinylpyridine and polyvinylpyrrolidone; and constituents (*a*), (*b*), (*c*), (*d*) and (*e*) being present in the respective amounts of 10 to 60, 0.0001 to 6, 2 to 25, 40 to 90 and 0.5 to 10 parts by weight.

6. An element as defined in claim 5 wherein constituent (*a*) is an acrylic acid diester of a mixture of polyethylene glycols of average molecular weight between 200 and 600.

7. An element as defined in claim 5 wherein said constituent (*d*) is cellulose acetate.

8. An element as defined in claim 5 wherein said constituent (*d*) is cellulose acetate succinate.

9. An element as defined in claim 5 which has antihalation material beneath the photopolymerizable layer.

10. An element as defined in claim 5 wherein the support is a sheet of metal.

References Cited in the file of this patent

UNITED STATES PATENTS

| | | |
|---|---|---|
| 2,757,089 | Moessen | July 31, 1956 |
| 2,902,365 | Martin | Sept. 1, 1959 |
| 2,927,023 | Martin | Mar. 1, 1960 |